(12) United States Patent
Alexander et al.

(10) Patent No.: US 7,265,615 B2
(45) Date of Patent: Sep. 4, 2007

(54) MULTIPLE DIFFERENTIAL AMPLIFIER SYSTEM AND METHOD FOR TRANSCONDUCTANCE MISMATCH COMPENSATION

(75) Inventors: Alasdair G. Alexander, Andover, MA (US); Chau C. Tran, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 146 days.

(21) Appl. No.: 11/172,186

(22) Filed: Jun. 30, 2005

(65) Prior Publication Data

US 2007/0001758 A1 Jan. 4, 2007

(51) Int. Cl.
*H03F 3/45* (2006.01)
(52) U.S. Cl. ............................................. 330/69; 330/9
(58) Field of Classification Search ..................... None
See application file for complete search history.

(56) References Cited

U.S. PATENT DOCUMENTS 6,498,530 B1 * 12/2002 Tang .............................. 330/9
6,844,775 B2 * 1/2005 Doorenbos et al. ........... 330/69

* cited by examiner

*Primary Examiner*—Khanh Van Nguyen
(74) *Attorney, Agent, or Firm*—Iandiorio & Teska

(57) ABSTRACT

A multiple differential amplifier system and method for transconductance mismatch compensation which in a first phase connects to a differential switched input of a null amplifier, the differential signal input of the main amplifier, inverted, for compensating for offset errors and transconductance mismatches in the null amplifier; and storing in a null storage device connected to an auxiliary input of the null amplifier the output of the null amplifier representing the compensation for the offset error and transconductance mismatch of the null amplifier; and in a second phase connecting the differential switched input of the null amplifier to the differential feedback input of the main amplifier and storing in the main storage device connected to an auxiliary input of the main amplifier the output of the null amplifier representing the compensation for the main amplifier offset error and transconductance mismatch.

9 Claims, 8 Drawing Sheets

MULTIPLE DIFFERENTIAL AMPLIFIER SYSTEM AND METHOD FOR TRANSCONDUCTANCE MISMATCH COMPENSATION

FIELD OF THE INVENTION

This invention relates to a method and apparatus for compensating for transconductance mismatch in multiple differential amplifiers.

BACKGROUND OF THE INVENTION

Multiple differential amplifiers, for example, double differential amplifiers used as instrumentation amplifiers, typically include two input differential transconductance stages connected in shunt configuration. The combination of their current outputs drives a main amplifier. The output from the main amplifier is connected to a negative feedback resistor network, which sets the gain for the combined signal. An advantage of fully differential signal paths is to reject the common mode noise or interference. The implementation of double differential input amplifier circuits as a realization of this practice is well established. The instrumentation amplifier operates by nulling the difference between the outputs of the differential transconductance stages. Their outputs will match when their inputs match so that the circuit, which nulls their difference, must drive the input which it controls to match the voltage of the one it does not control. In such a configuration the two transconductance inputs must be accurately matched. However, lithographic tolerances in mask production of monolithic semiconductor devices together with planar irregularities inherent in the manufacture of such devices limit the matching of such structures. Furthermore, temperature gradients across the circuit during operation may degrade the matching of transconductances and lead to distortion. As a result, presently, while offset error can be and is compensated for, transconductance mismatch is not.

BRIEF SUMMARY OF THE INVENTION

It is therefore an object of this invention to provide an improved method and apparatus for compensating for transconductance mismatch in multiple differential amplifiers.

It is a further object of this invention to provide an improved apparatus for compensating for transconductance mismatch in multiple differential amplifiers as well as for offset errors.

It is a further object of this invention to provide an improved method and apparatus for compensating for transconductance mismatch in multiple differential amplifiers which compensate for transconductance mismatch due to dynamic and static effects, e.g. thermal gradients, package stress effects and other manufacturing tolerances, respectively.

It is a further object of this invention to provide an improved method an apparatus for compensating for transconductance mismatch in multiple differential amplifiers which enables the use of lower tolerance components resulting in lower area requirements and greater yield.

The invention results from the realization that multiple differential amplifiers, e.g. double differential amplifiers and greater can be compensated for transconductance mismatch by first connecting to a differential switched input of a null amplifier, the differential signal input of the main amplifier, inverted, for compensating for offset errors and transconductance mismatch in the null amplifier; and storing in a null storage device connected to an auxiliary input of the null amplifier, the output of the null amplifier representing the compensation for the offset error and transconductance mismatch of the null amplifier; and second, connecting the differential switched input of the null amplifier to the differential feedback input of the main amplifier and storing in the main storage device connected to an auxiliary input of the main amplifier, the output of the null amplifier representing the compensation for the main amplifier transconductance mismatch and offset error.

The subject invention, however, in other embodiments, need not achieve all these objectives and the claims hereof should not be limited to structures or methods capable of achieving these objectives.

This invention features a multiple differential amplifier system with transconductance mismatch compensation including a main amplifier having a differential signal input and a differential feedback input and a null amplifier having a differential signal input and a differential switched input. There is a null storage device connected to an auxiliary input of the null amplifier and a main storage device connected to the auxiliary input of the main amplifier. The switching system connects to the differential switched input of the null amplifier the differential signal input of the main amplifier, inverted, in a first phase for compensating for offset errors and transconductance mismatches in the null amplifier and stores in the null storage device the output signal of the null amplifier representing compensation for the offset effort and transconductance mismatch of the nulling amplifier. In a second phase the differential switched input of the null amplifier is connected to the differential feedback input of the main amplifier and the output of the null amplifier representing the compensation for the main amplifier offset error and transconductance mismatch error is stored in the main storage device to compensate for the offset error and transconductance mismatch in the main amplifier.

In a preferred embodiment each amplifier may includes at least two transconductance amplifiers. The storage devices may include hold capacitors each of the amplifier may be a double differential amplifier.

The invention also features a method of compensating for transconductance mismatch in a multiple differential amplifier system. In a first phase the differential signal input of the main amplifier, inverted, is connected to a differential switched input of a null amplifier for compensating for offset errors in transconductance mismatches in the null amplifier. The output of the null amplifier representing the compensation for the offset error and transconductance mismatch of the null amplifier is connected to the auxiliary input of the main amplifier. In a second phase the differential switched input of the null amplifier is connected to the differential feedback input of the main amplifier and is connected to an auxiliary input of the main amplifier. The output of the null amplifier represents the compensation for the main amplifier offset error and transconductance mismatch.

In a preferred embodiment each amplifier may have at least two transconductance amplifiers. The output of the null amplifier in each phase may be stored in a storage device. The storage devices may include hold capacitors. Each of the amplifiers may be a double differential amplifier.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
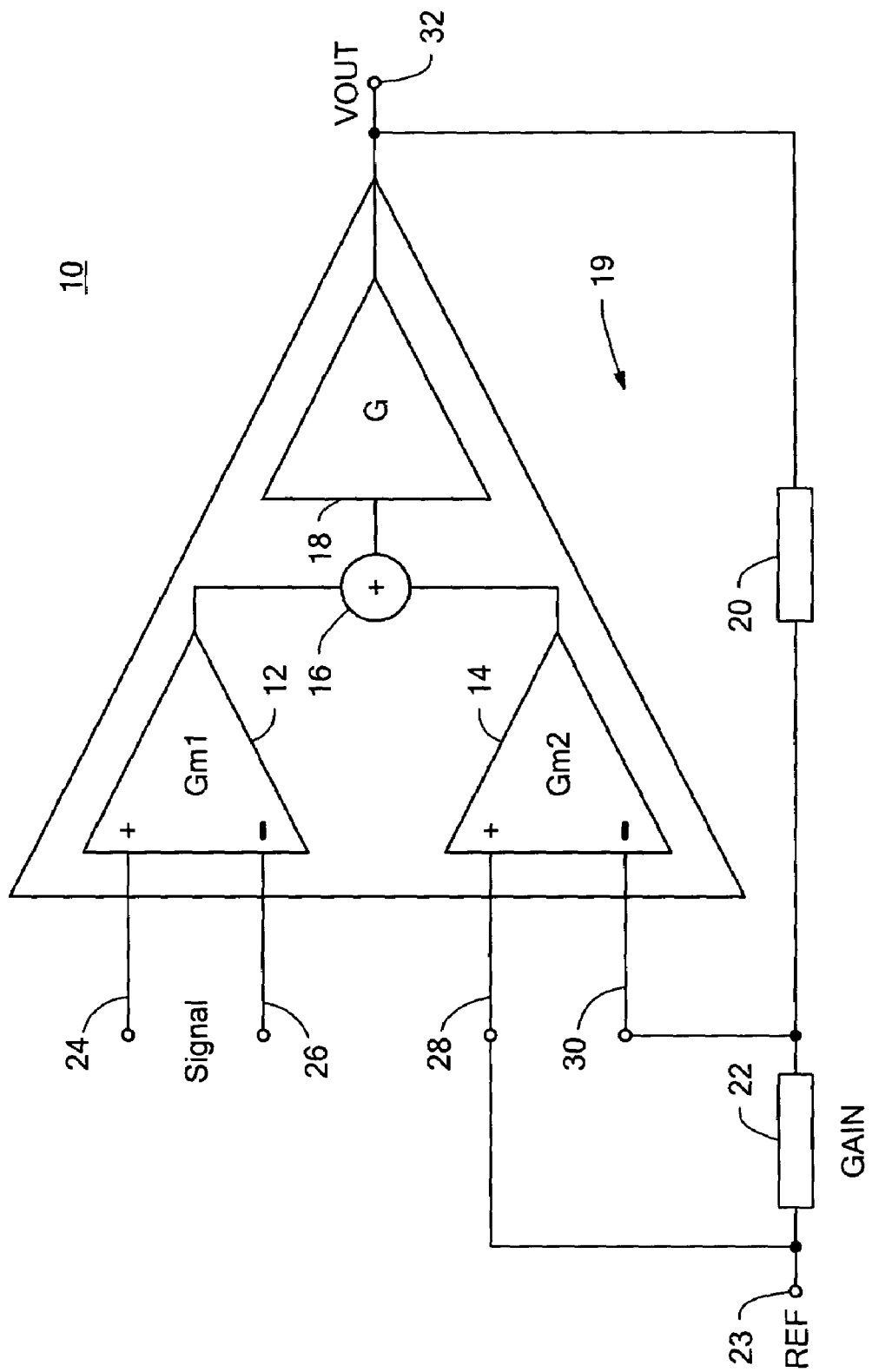
FIG. 1 is a schematic diagram of a prior art multiple differential amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, a prior art, multiple differential amplifier 10 including transconductance amplifiers 12 and 14, summing circuit 16, gain amplifier 18, and feedback circuit 19 including feedback resistor 20, and gain resistor 22. Feedback circuit 19 is connected to a reference 23 which may be ground, zero, or any suitable reference.

In operation a fully differential input signal is provided on differential inputs 24 and 26 to transconductance amplifier 12. Its output is summed in summing circuit 16 with the output from transconductance amplifier 14 whose differential input signal on lines 28 and 30 is provided by the feedback circuit 19, including feedback resistor 20 and gain resistor 22. Any difference between the output of transconductance amplifiers 12 and 14 will be reflected in the output from summing circuit 16. This output is amplified by gain amplifier 18 and provided to the output 32. This output is fed back through feedback circuit 19. With resistors 20 and 22 acting as a voltage divider the scaled down feedback signal is provided at inputs 28 and 30 to transconductance amplifier 14. When the feedback signal on differential inputs 28 and 30 is equivalent to that of the input signal on differential inputs 24 and 26 the output of summing circuits 16 is zeroed, and the output of gain amplifier 18 remains unchanged, so that the output signal at output 32 is a direct function of the input signal at differential inputs 24 and 26. Since this double differential amplifier 10 has a fully differential input common mode noise is eliminated.

Figure 2:
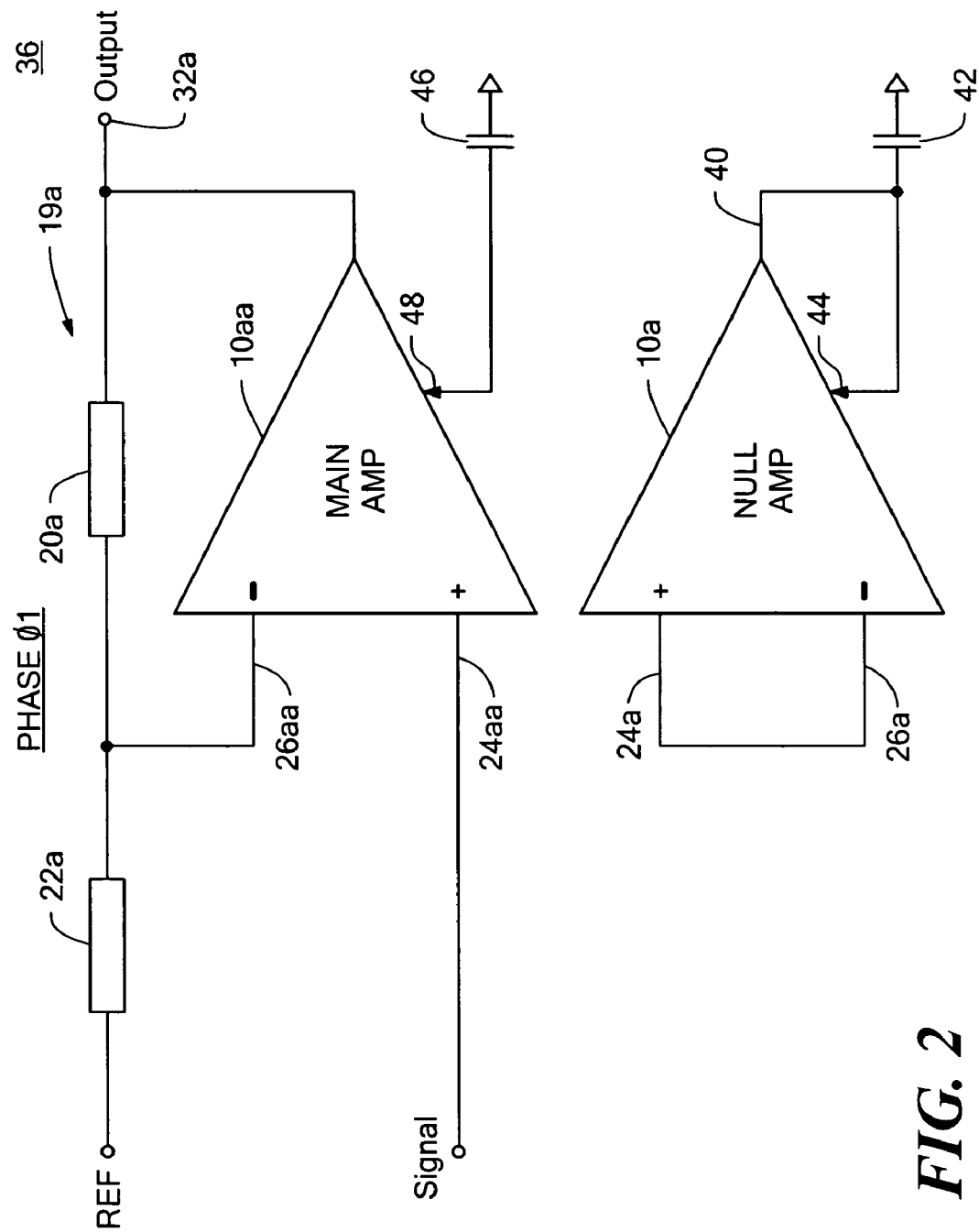
FIG. 2 is a schematic diagram of a prior art multiple differential amplifier system with a main amplifier and a null amplifier in a first phase of operation.
Figure 3:
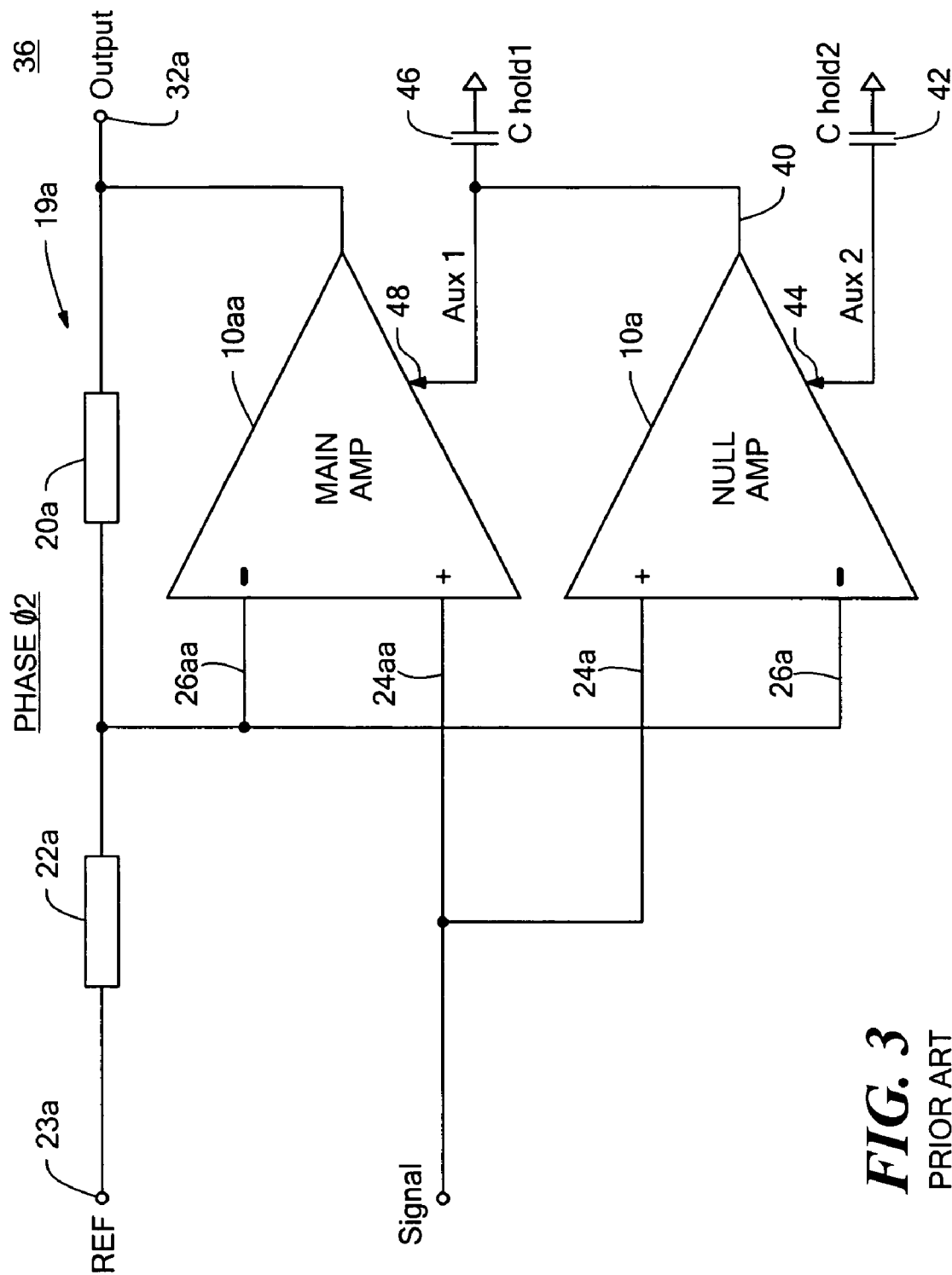
FIG. 3 is a schematic diagram of the prior art multiple differential amplifier system of FIG. 2 in a second phase of operation.

FIGS. 2 and 3 show a schematic diagram of a prior art differential amplifier system 36 which includes two such differential amplifiers 10a and 10aa configured to eliminate offset errors. One of the amplifiers 10a, FIG. 2, is a null amplifier; the other 10aa is the main amplifier. FIG. 2 represents the system in phase φ 1 operation; FIG. 3 shows the system in phase φ 2 operation.

In FIGS. 2 and 3 each of the amplifiers 10a and 10aa are shown as having only two inputs, but this is for simplification and ease of understanding only, as each actually has four inputs as shown with respect to amplifier 10 in FIG. 1.

In phase φ 1 operation, FIG. 2, the differential signal inputs 24a, 26a to null amplifier 10a are shorted together so that the input signal is zero. Any signal at the output 40 represents the offset error of null amplifier 10a. This value is stored in storage device 42 which may, for example, be a holding capacitor and delivered to an auxiliary input 44 of null amplifier 10a. As a result null amplifier 10a now provides an output at 40 which is compensated for offset error. Main amplifier 10aa also has a storage device such as a hold capacitor 46 associated with it and connected to an auxiliary input 48 of main amplifier 10aa.

In phase φ 2, FIG. 3, null amplifier 10a is now connected to the same signal inputs as main amplifier 10aa is at differential signal inputs 24aa and 26aa. Now null amplifier 10a having already been compensated for offset error provides its output on line 40 to be stored on hold capacitor 46 and delivered to auxiliary input 48 of main amplifier 10aa to compensate for its offset error so that the output of main amplifier 10aa appearing at 32a is also compensated for offset error.

While the shorting of the input to null amplifier 10a, FIG. 2, in accordance with the prior art works well to determine and compensate for the offset error it obscures or prevents compensation for the transconductance mismatch because with a shorted or zero input the mismatch between the transconductance amplifiers does not appear.

However, in accordance with this invention that problem is overcome as both the transconductance mismatch as well as the offset error is compensated for. This is done by applying in phase φ 1 the same input (for example the input signal) in inverted form to both transconductance amplifiers 12b, 14b, FIG. 4, of null amplifier 10b instead of shorting together its inputs. This still effects a balanced input which allows the offset error to be determined and compensated for but it also provides a non-zero input so that any mismatch in transconductance of amplifiers 12b and 14b will appear. Thus, the output of null amplifier 10b in phase φ 1, FIG. 4, which is stored in a null storage device, hold capacitor 42b, and supplied to auxiliary input 44b, represents compensation for both the offset error and the transconductance mismatch of null amplifier 10b. In phase φ 1 in main amplifier 10bb the differential feedback inputs 28bb and 30bb of transconductance amplifier 12bb are connected to feedback circuit 19b and the differential switched inputs 24bb, 26bb are connected directly to the input. Also in phase φ 1 the differential signal input is provided directly to differential inputs 28b and 30b of transconductance amplifier 12b, but inverted to the other differential signal inputs 24b, 26b of transconductance amplifier 14b in null amplifier 10b. In phase φ 2, FIG. 5, the input signal is delivered to inputs 24b, 26b of null amplifier 10b and inputs 24bb, 26bb of main amplifier 10bb, while inputs 28b, 30b of null amplifier 10b and inputs 28bb, 30bb of main amplifier 10bb are connected to feedback circuit 19b. The output of null amplifier 10b is now stored in main storage device, hold capacitor 46b, and delivered to auxiliary input 48b of main amplifier 10bb to compensate for transconductance mismatch as well as offset error.

Figure 4:
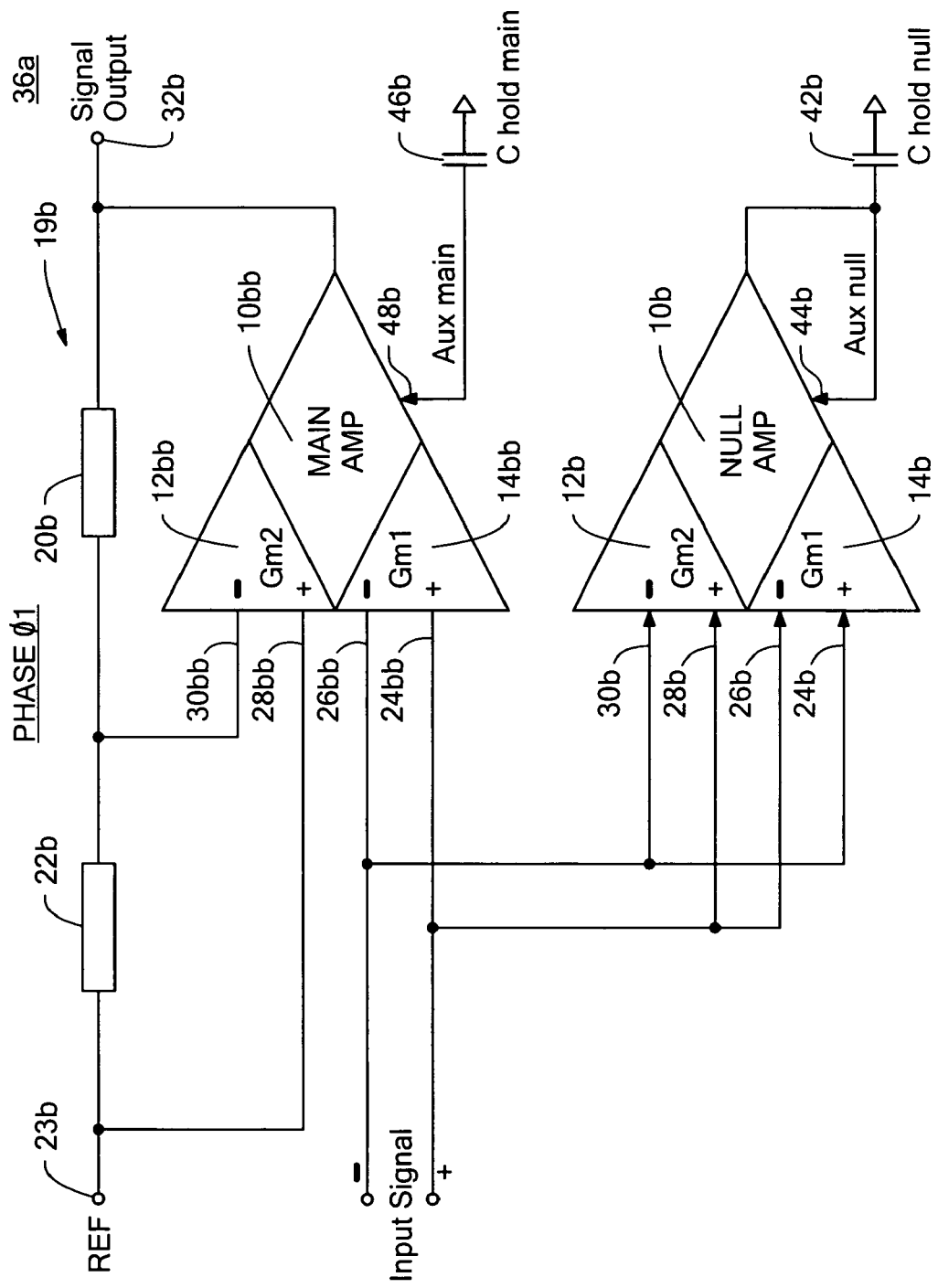
FIG. 4 is a schematic diagram of a multiple differential amplifier system with a main amplifier and a null amplifier in a first phase of operation according to this invention.
Figure 5:
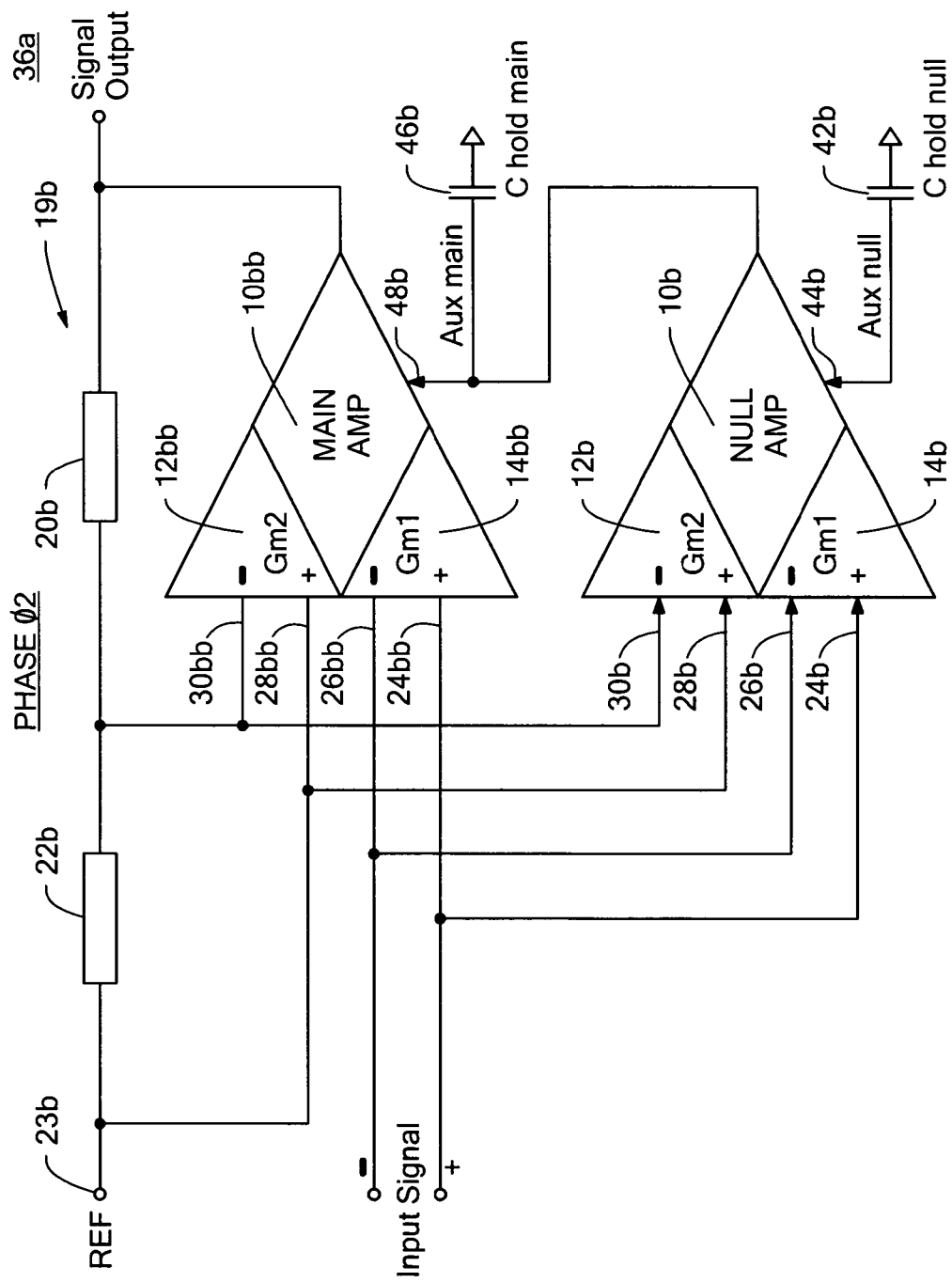
FIG. 5 is a schematic diagram of the multiple differential amplifier system of FIG. 4 in a second phase of operation according to this invention.

The two different phase operations, phase φ1, FIG. 4 and phase φ2, FIG. 5, demonstrate the conditions of the system 36a in each of those phases. In actuality these two states or conditions are effected by means of switching system 50, FIG. 6, which includes signal switching circuits 52, 54, feedback switching circuits 56, 58 and nulling switching circuits 60, and 62 which are operated in phase φ1 and phase φ2 as indicated in the drawing.

Figure 6:
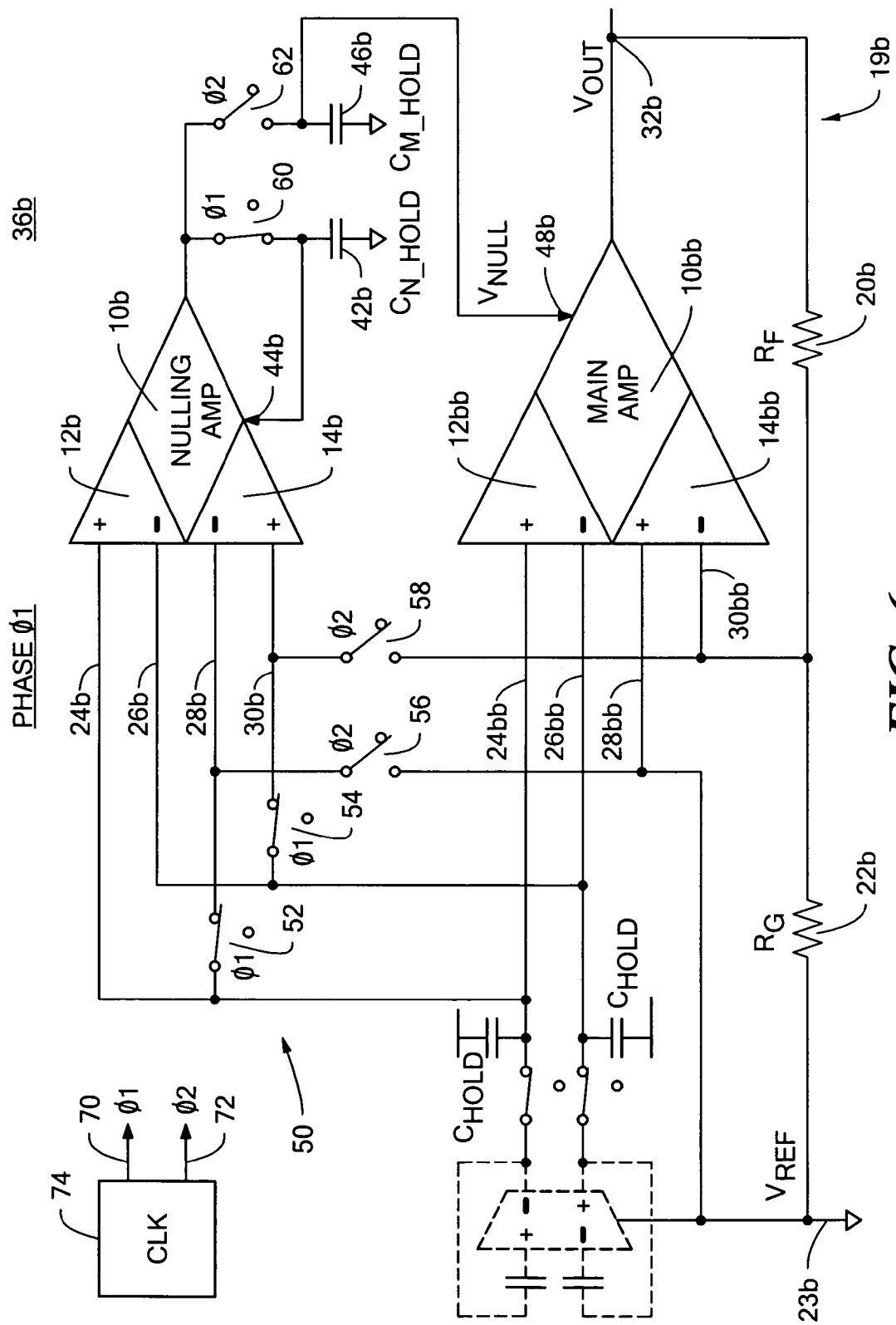
FIG. 6 is a more detailed schematic view similar to FIG. 4 showing the switching system set for the first phase.
Figure 7:
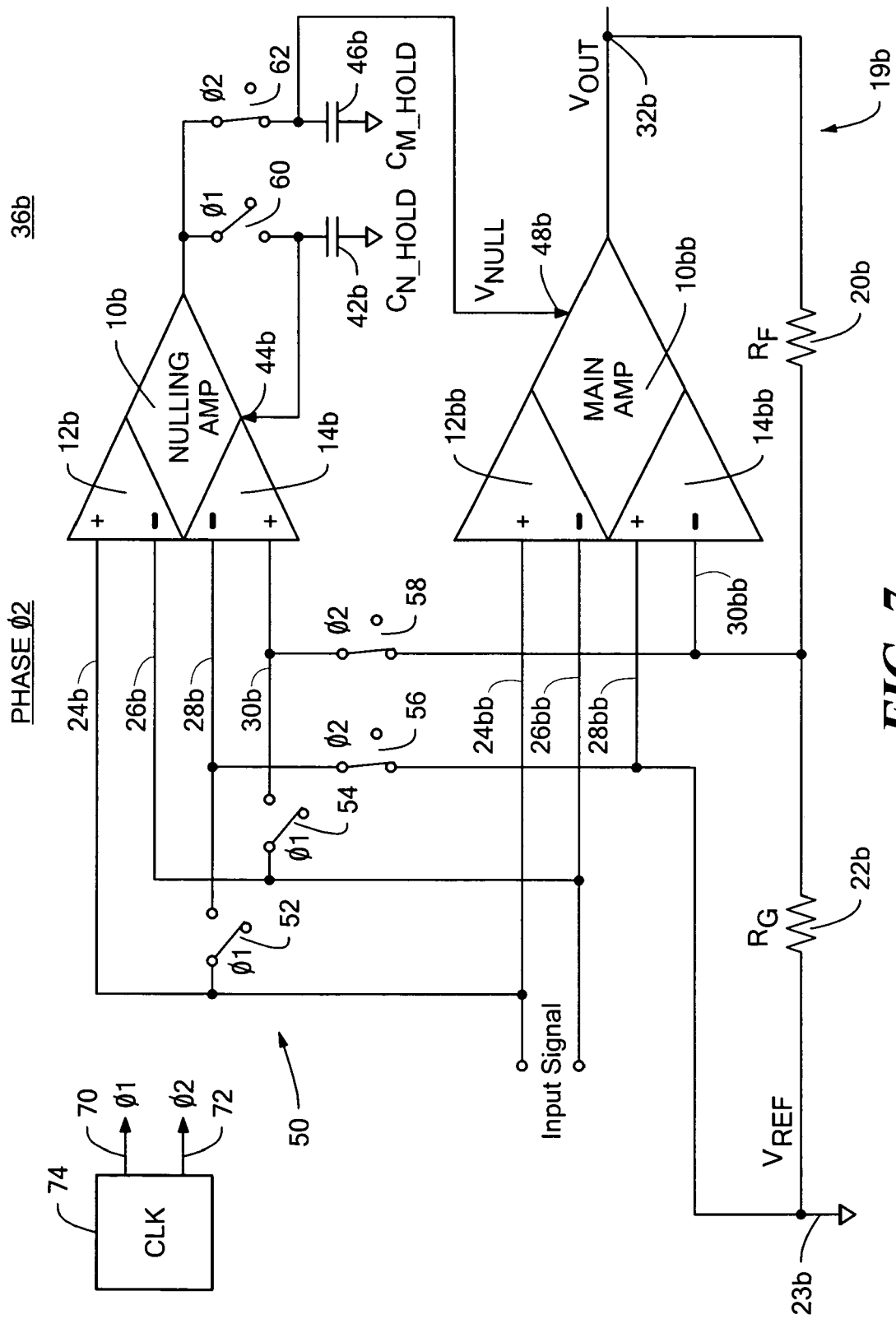
FIG. 7 is a schematic view similar to FIG. 6 showing the switching system set for the second phase.
Figure 8:
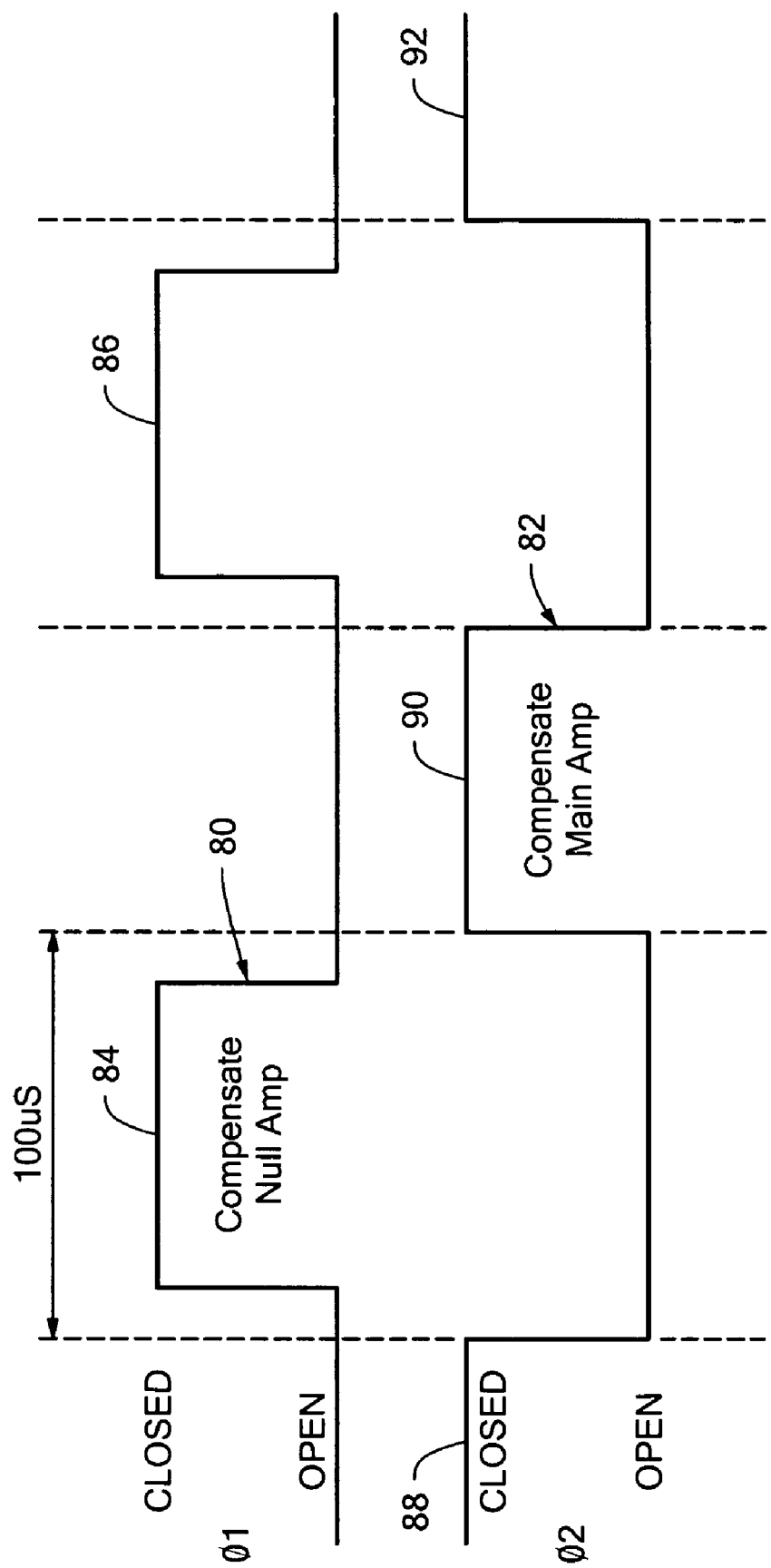
FIG. 8 is an illustration of the timing signals for establishing the phases.

The phase signals, phase φ1 70, phase φ2 72, FIG. 6, are provided by a clock circuit 74. In phase φ1, FIG. 6, switch 52 and 54 are in the position shown so that null amplifier 10b receives the input signal at inputs 24b and 26b and the inverted input signal at inputs 28b and 30b. At this time also in phase φ1 switch 60 is in the position as shown so that the compensating output from null amplifier 10b is stored on hold capacitor 42b and provided to auxiliary input 44b of null amplifier 10b thereby compensating for its own transconductance mismatch and offset error. In phase φ1 switches 56, 58 and 62 are open as shown. In phase φ2, FIG. 7, switches 52 and 54 are open and switches 56 and 58 are closed so now the feedback inputs of main amplifier 10bb are provided to the feedback inputs 28b and 30b of null amplifier 10b. Switches 52 and 54 are open as is switch 60 but now switch 62 is closed and so the output of null amplifier 10b is stored on hold capacitor 46b and provided to auxiliary input 48b of main amplifier 10bb, thereby compensating for its transconductance mismatch as well as its offset error. While storage devices 42b and 46b are shown as hold capacitors any suitable storage device will do. For example, this signal may be run through an analog to digital converter then stored in a digital storage where it can be operated on more easily and then returned through a digital to analog converter for input to the amplifiers 10b and 10bb. The phase φ1 80 and phase φ2 82, FIG. 8, signals are shown as non-overlapping timing signals. Phase φ1 80 closes the relevant switches during the compensation of null amplifier 10b as indicated at positive pulses 84 and 86, for example. In phase φ2 the compensation of the main amplifier takes place during the positive levels of pulses 88, 90, 92, for example.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A multiple differential amplifier system with transconductance mismatch compensation comprising:
   a main amplifier having a differential signal input and a differential feedback input;
   a null amplifier having a differential signal input and a differential switched input;
   a null storage device connected to an auxiliary input of said null amplifier;
   a main storage device connected to an auxiliary input of said main amplifier;
   a switching system for connecting to said differential switched input of said null amplifier to said differential signal input of said main amplifier inverted in a first phase for compensating for offset errors and transconductance mismatches in said null amplifier; and storing in said null storage device an output of said null amplifier representing compensation for the offset error and transconductance mismatch in said null amplifier; and in a second phase connecting said differential switched input of said null amplifier to said differential feedback input of said main amplifier, and storing in said main storage device the output of said null amplifier representing the compensation for the main amplifier offset error and transconductance mismatch error for compensating for the offset error and transconductance mismatch of said main amplifier.

2. The multiple differential amplifier system with transconductance mismatch compensation of claim 1 in which the main amplifier and the null amplifier each has at least two transconductance amplifiers.

3. The multiple differential amplifier system with transconductance mismatch compensation of claim 1 in which said storage devices include hold capacitors.

4. The multiple differential amplifier system with transconductance mismatches compensation of claim 1 in which the main amplifier and the null amplifier each is a double differential amplifier.

5. A method of compensating for transconductance mismatch in a multiple differential amplifier system comprising:
   in a first phase connecting to a differential switched input of a null amplifier to a differential signal input of a main amplifier inverted for compensating for offset errors and transconductance mismatches in the null amplifier; and connecting to an auxiliary input of the null amplifier an output of the null amplifier representing the compensation for the offset error and transconductance mismatch of the null amplifier; and
   in a second phase connecting the differential switched input of the null amplifier to a differential feedback input of the main amplifier and connecting to an auxiliary output of the main amplifier, the output of the null amplifier representing the compensation for the main amplifier offset error and transconductance mismatch.

6. The method of compensating for transconductance mismatch in a multiple differential amplifier system of claim 5 in which the main amplifier and the null amplifier each has at least two transconductance amplifiers.

7. The method of compensating for transconductance mismatch in a multiple differential amplifier system of claim 5 in which the output of said null amplifier in each phase is stored in a storage device.

8. The method of compensating for transconductance mismatch in a multiple differential amplifier system of claim 7 in which said storage devices include hold capacitors.

9. The method of compensating for transconductance mismatch in a multiple differential amplifier system of claim 5 in which the main amplifier and the null amplifier each is a double differential amplifier.

* * * * *